(12) United States Patent
Park (10) Patent No.: US 11,042,493 B2
(45) Date of Patent: Jun. 22, 2021

(54) MEMORY SYSTEM

(71) Applicant: SK hynix Inc., Gyeonggi-do (KR)

(72) Inventor: Chang Kyun Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/570,315

(22) Filed: Sep. 13, 2019

(65) Prior Publication Data

US 2020/0242056 A1 Jul. 30, 2020

(30) Foreign Application Priority Data

Jan. 28, 2019 (KR) .......................... 10-2019-0010756

(51) Int. Cl.
*G06F 13/16* (2006.01)
*G06F 3/06* (2006.01)
*G11C 11/409* (2006.01)

(52) U.S. Cl.
CPC ........ *G06F 13/1689* (2013.01); *G06F 3/0614* (2013.01); *G06F 3/0659* (2013.01); *G06F 3/0679* (2013.01); *G06F 13/1605* (2013.01); *G11C 11/409* (2013.01)

(58) Field of Classification Search
CPC .... G06F 3/0635; G06F 13/16; G06F 13/4234; G06F 13/1689
See application file for complete search history.

(56) References Cited

U.S. PATENT DOCUMENTS

| | | | | |
|---|---|---|---|---|
| 8,826,461 | B2* | 9/2014 | Yu | G11B 20/00086 |
| | | | | 726/32 |
| 9,729,320 | B2* | 8/2017 | Haider | H04L 9/0894 |
| 10,430,361 | B1* | 10/2019 | Wiebe | G06F 3/0673 |
| 2008/0256374 | A1* | 10/2008 | Harris | G06F 13/16 |
| | | | | 713/323 |
| 2012/0221769 | A1* | 8/2012 | Ware | G06F 3/0634 |
| | | | | 711/103 |
| 2019/0348095 | A1* | 11/2019 | Koh | G11C 7/109 |
| 2020/0110714 | A1* | 4/2020 | Richter | G06F 3/0607 |

FOREIGN PATENT DOCUMENTS

KR 101522293 5/2015
KR 1020150136891 12/2015

* cited by examiner

*Primary Examiner* — Edward J Dudek, Jr.
(74) *Attorney, Agent, or Firm* — IP & T Group LLP (57) ABSTRACT

A memory system includes a memory device, a memory controller configured to control the memory device, and an interface device configured to perform an interfacing operation for transmission of a control signal and data between the memory device and the memory controller. The interface device activates a blocking function for the interfacing operation in response to a configuration command of the memory controller including a blocking activation signal and performs an interface configuration operation in response to an interface configuration command of the memory controller while the blocking function is activated.

17 Claims, 10 Drawing Sheets

| Current state of blocking function of interface device | Set feature command | | | Operation of interface device | Operation of memory device |
|---|---|---|---|---|---|
| | CMD | ADD | DATA | | |
| Deactivated | EFh | PA1 | P1 | Interfacing operation | Memory configuration operation |
| Deactivated | EFh | FFh | BLK_ON | Activate blocking function | - |
| Activated | EFh | PA2 | P2 | Interface configuration operation | - |
| Activated | EFh | FFh | BLK_OFF | Deactivate blocking function | - |

MEMORY SYSTEM

CROSS-REFERENCES TO RELATED APPLICATION

The present application claims priority under 35 U.S.C. § 119(a) to Korean application number 10-2019-0010756, filed on Jan. 28, 2019, which is incorporated herein by reference in its entirety.

BACKGROUND

1. Technical Field

Various embodiments generally relate to a memory system, and more particularly, to a memory system including a memory device.

2. Related Art

A memory system may be configured to store data, provided by a host device in response to a write request from the host device. Furthermore, the memory system may be configured to provide stored data to the host device in response to a read request from the host device. The host device is an electronic device capable of processing data, and may include a computer, a digital camera or a mobile phone. The memory system may operate in such a way as to be embedded in the host device or may operate in such a way as to be fabricated in a separate form and connected to the host device.

SUMMARY

Various embodiments are directed to a memory system capable of efficiently adjusting the configuration of an interface device electrically coupled to a memory device.

In accordance with the embodiments, a memory system includes a memory device, a memory controller configured to control the memory device, and an interface device configured to perform an interfacing operation for transmission of a control signal and data between the memory device and the memory controller. The interface device may activate a blocking function for the interfacing operation in response to a configuration command of the memory controller including a blocking activation signal, and may perform an interface configuration operation in response to an interface configuration command of the memory controller while the blocking function is activated.

In accordance with the embodiments, a memory system includes a memory device, a memory controller configured to generate a command for controlling the memory device, and an interface device configured to transmit the command to the memory device by performing an interfacing operation in response to the command transmitted by the memory controller while a blocking function is deactivated. The memory controller may transmit the command, which includes a blocking activation signal, to the interface device. The interface device may activate the blocking function in response to the command including the blocking activation signal, and may not perform the interfacing operation while the blocking function is activated.

In accordance with the embodiments, a memory system includes a memory device, a memory controller, and an interface device including a blocking configuration unit and configured to perform an interfacing operation between the memory device and the memory controller. The memory controller may activate a blocking function of the interface device by accessing the blocking configuration unit. The interface device may not perform the interfacing operation while the blocking function is activated.

In accordance with the embodiments, a memory system includes a memory device configured to perform a storage operation to a cell array included therein; a controller configured to control the memory device to perform the storage operation; and an interface configured to control communication between the controller and the memory device. The controller may control the interface to block the communication by providing the interface with a block command including first identification information and a memory command used for the memory device. The controller may control the interface to perform an interface configuration operation thereto by providing the interface with a configuration command including second identification information, interface configuration data and the memory command.

DETAILED DESCRIPTION

Hereinafter, a memory system will be described below with reference to the accompanying drawings through various examples of embodiments.

Merits and characteristics and a method for achieving the merits and characteristics will become more apparent from embodiments described below in detail in conjunction with the accompanying drawings. However, the disclosure is not limited to the disclosed embodiments, but may be implemented in various different ways. The embodiments are provided to only describe this specification in detail so that those skilled in the art can easily carry out the technical spirit of the disclosure.

In the drawings, the embodiments are not limited to specific forms illustrated in the drawings and have been enlarged for clarity. Specific terms have been used in the specification, but the terms are used to only describe the embodiments, and are not used to limit the meaning of the terms written in the claims.

In the specification, the expression "and/or" means to include at least one of the elements listed before and after the expression. Furthermore, the expression "connected/coupled" means including that one element is directly connected to the other element or that two elements are indirectly connected by a third element. In the specification, the singular form may include the plural form unless specially described otherwise. Furthermore, terms, such as "includes or comprises" and/or "including or comprising" used in the specification, mean existence or addition of one or more other elements, steps, operations and/or devices in the described elements, steps, operations and/or devices.

Embodiments will be described in detail below with reference to the accompanying drawings.

Figure 1:
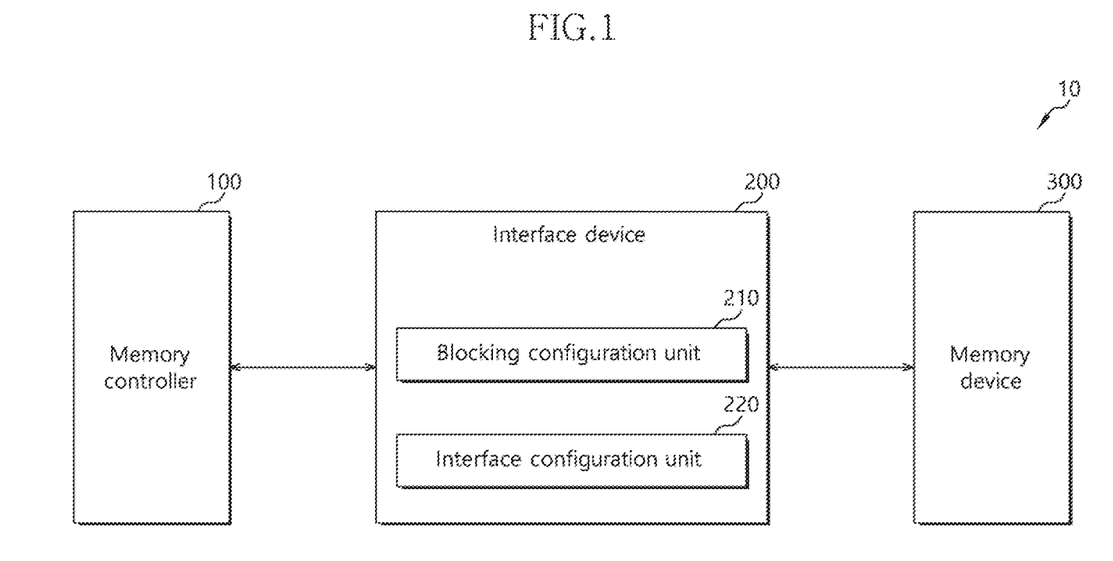
FIG. 1 is a block diagram illustrating a memory system in accordance with an embodiment.

FIG. 1 is a block diagram showing a memory system 10 in accordance with an embodiment.

The memory system 10 may be configured to store data provided by an external host device in response to a write request from the host device. Furthermore, the memory system 10 may be configured to provide stored data to the host device in response to a read request from the host device.

The memory system 10 may be configured with a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 10 may include a memory controller 100, an interface device 200, and a memory device 300.

The memory controller 100 may control a general operation of the memory system 10. The memory controller 100 may control the memory device 300 through the interface device 200 in order to perform a foreground operation according to a request from the host device. The foreground operation may include an operation of writing data in the memory device 300 and reading data from the memory device 300 in response to a write request and read request from the host device.

Furthermore, the memory controller 100 may control the memory device 300 through the interface device 200 in order to perform a background operation internally necessary and independent of a request from the host device. The background operation may include a wear leveling operation, a garbage collection operation, and an erase operation for the memory device 300. Like the foreground operation, the background operation may include an operation of writing data in the memory device 300 and reading data from the memory device 300.

The memory controller 100 may control the memory device 300 through the interface device 200. The memory controller 100 may generate a command for controlling the memory device 300, and may transmit the command to the interface device 200.

Furthermore, the memory controller 100 may activate a blocking function of the interface device 200, and may adjust an internal configuration of the interface device 200.

To this end, the memory controller 100 may generate a configuration command and an interface configuration command to be described below in detail, and may transmit the commands to the interface device 200. In this case, the memory controller 100 may generate the configuration command and the interface configuration command using memory commands for controlling the memory device 300 without any change.

Specifically, the memory controller 100 may transmit a configuration command, including a blocking activation signal, to the interface device 200. The blocking activation signal may enable the interface device 200 to activate the blocking function. The interface device 200 may not perform an interfacing operation between the memory controller 100 and the memory device 300, while the blocking function is activated.

Accordingly, the memory controller 100 may transmit an interface configuration command to the interface device 200, while the blocking function of the interface device 200 is activated. The interface configuration command may enable the interface device 200 to perform an interface configuration operation. That is, the memory controller 100 may adjust the internal configuration of the interface device 200, while the blocking function of the interface device 200 is activated.

Furthermore, the memory controller 100 may transmit the configuration command, including a blocking deactivation signal, to the interface device 200, while the blocking function of the interface device 200 is activated. The blocking deactivation signal may enable the interface device 200 to deactivate the blocking function. After the blocking function of the interface device 200 is deactivated, the memory controller 100 may control the memory device 300 through the interface device 200.

The memory controller 100 may use the configuration command, not including a blocking activation signal, to control the memory device 300, while the blocking function of the interface device 200 is deactivated. While the blocking function of the interface device 200 is deactivated, the configuration command may be transmitted to the memory device 300 through the interface device 200. That is, the configuration command is not a command separately configured or newly designed to control only the blocking function of the interface device 200, but an existing command for controlling the memory device 300.

In an embodiment, the memory controller 100 may generate a command for activating the blocking function of the interface device 200 and a command for deactivating the blocking function so that the commands have different configurations.

The interface device 200 may perform an interfacing operation between the memory controller 100 and the memory device 300, while the blocking function is deactivated. The interface device 200 may transmit a command, including a control signal and data transmitted by the memory controller 100, to the memory device 300 by performing the interfacing operation. The interface device 200 may tune a command transmitted by the memory controller 100 (or adjust a timing of the command), and may transmit the tuned (or adjusted) command to the memory device 300. If the memory controller 100 and the memory device 300 are directly coupled electrically, the interface device 200 may be electrically coupled between the memory controller 100 and the memory device 300 as a separate chip and perform an interfacing operation, in order to solve a phenomenon in which capacitance increases.

When the configuration command transmitted by the memory controller 100 includes a blocking activation signal, the interface device 200 may activate the blocking function. The interface device 200 may not perform an interfacing operation while the blocking function is activated. That is, while the blocking function is activated, the interface device 200 may not transmit a command, transmitted by the memory controller 100, to the memory device 300.

While the blocking function is activated, the interface device 200 may perform an interface configuration operation in response to an interface configuration command transmitted by the memory controller 100.

While the blocking function of the interface device 200 is activated, signal transmission between the interface device 200 and the memory device 300 may not be completely blocked. The interface device 200 may perform an interface configuration operation by exchanging signals with the memory device 300 in response to an interface configuration command transmitted by the memory controller 100.

Furthermore, when the configuration command transmitted by the memory controller 100 includes a blocking deactivation signal while the blocking function is activated, the interface device 200 may deactivate the blocking function.

The interface device 200 may include a blocking configuration unit 210 and an interface configuration unit 220. The blocking configuration unit 210 and the interface configuration unit 220 include all circuits, systems, software, firmware and devices necessary for their respective operations and functions.

The blocking configuration unit 210 may store a blocking activation signal or blocking deactivation signal transmitted by the memory controller 100. The interface device 200 may activate the blocking function by storing a blocking activation signal in the blocking configuration unit 210. Furthermore, the interface device 200 may deactivate the blocking function by storing a blocking deactivation signal in the blocking configuration unit 210.

In an embodiment, an address may be assigned to the blocking configuration unit 210. In such a case, the memory controller 100 may generate a configuration command, including the address of the blocking configuration unit 210 and a blocking activation signal/blocking deactivation signal. That is, the memory controller 100 may control the blocking function of the interface device 200 by accessing the blocking configuration unit 210 through the address. When the configuration command transmitted by the memory controller 100 includes the address of the blocking configuration unit 210, the interface device 200 may store a blocking activation signal/blocking deactivation signal, included in the configuration command, in the blocking configuration unit 210. The interface device 200 may activate the blocking function when the blocking activation signal is stored in the blocking configuration unit 210, and may deactivate the blocking function when the blocking deactivation signal is stored in the blocking configuration unit 210.

The interface configuration unit 220 may store an interface configuration value to which reference is made by the interface device 200 in order to perform an interfacing operation. The interface device 200 may adjust an interface configuration value, stored in the interface configuration unit 220, by performing an interface configuration operation. For example, the interface configuration value may include various internal data values, voltage levels and operation thresholds used by the interface device 200.

Each of the blocking configuration unit 210 and the interface configuration unit 220 may include a flipflop, a latch, a register, etc. for storing a blocking activation signal/blocking deactivation signal or an interface configuration value.

The memory device 300 may store data under the control of the memory controller 100. The memory device 300 may receive a command, generated by the memory controller 100, from the interface device 200, and may perform an internal operation in response to the command.

The memory device 300 may include a nonvolatile memory device or a volatile memory device.

The nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

The volatile memory device may include a Static Random Access Memory (SRAM), a Dynamic Random Access Memory (DRAM), and the like.

FIG. 1 illustrates that the memory system 10 includes one interface device 200 and one memory device 300, but the embodiment is not limited thereto. In an embodiment, the memory system 10 may include a plurality of interfaces electrically coupled to the memory controller 100, and each interface may be electrically coupled to a plurality of memory devices.

Figure 2:
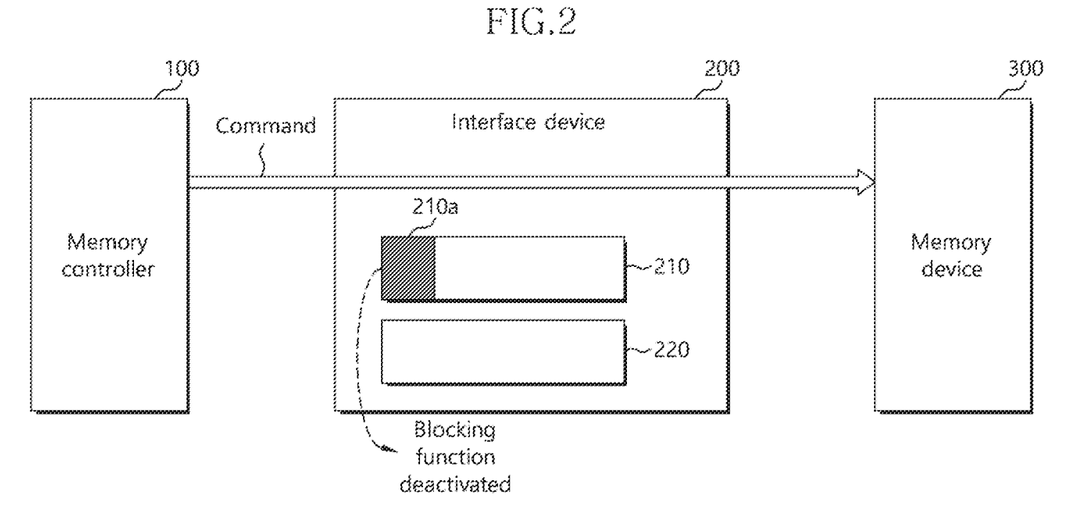
FIG. 2 is a diagram illustrating a method for an interface device to perform an interfacing operation in accordance with an embodiment.

FIG. 2 is a diagram illustrating a method for the interface device 200 to perform an interfacing operation in accordance with an embodiment. Referring to FIG. 2, while the blocking function is deactivated, the interface device 200 may transmit a command, transmitted by the memory controller 100, to the memory device 300 by performing an interfacing operation.

Specifically, a region 210a included in the blocking configuration unit 210 may be the place for storing a blocking activation signal or blocking deactivation signal transmitted by the memory controller 100. A blackened region 210a may indicate that a blocking deactivation signal is now being stored.

Accordingly, the memory controller 100 may generate a command for controlling the memory device 300, and may transmit the command to the interface device 200. The interface device 200 may receive the command from the memory controller 100, and may transmit the command to the memory device 300. The command may be a command for controlling an internal operation, such as a write operation, a read operation or an erase operation for the memory device 300, for example.

Figure 3:
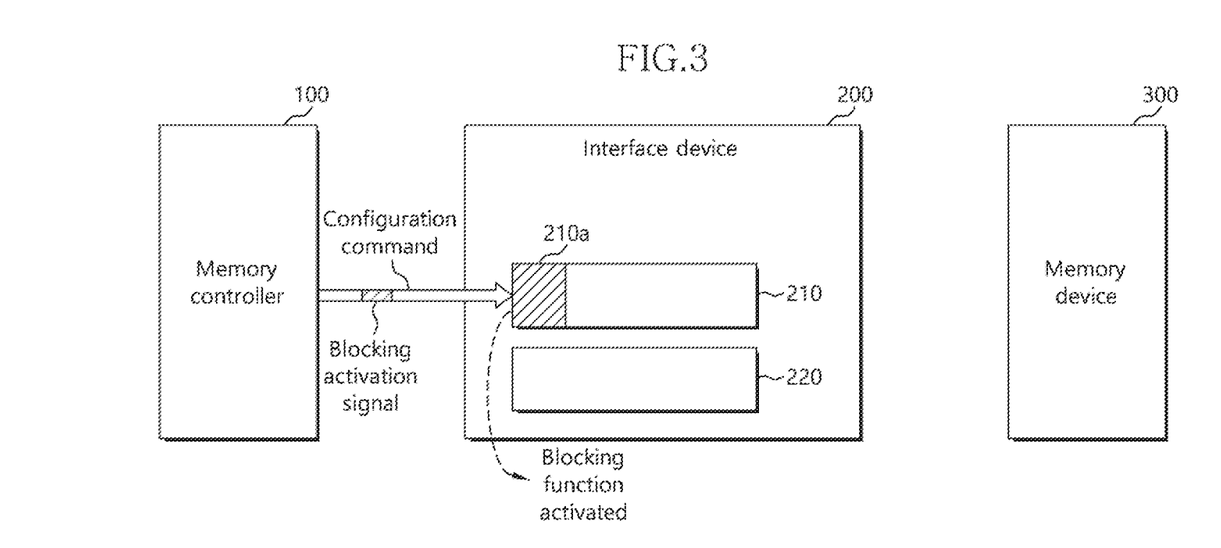
FIG. 3 is a diagram illustrating a method for a memory controller to activate a blocking function of the interface device in accordance with an embodiment.

FIG. 3 is a diagram illustrating a method for the memory controller 100 to activate a blocking function of the interface device 200 in accordance with an embodiment. Referring to FIG. 3, the interface device 200 may activate the blocking function in response to a configuration command transmitted by the memory controller 100.

Specifically, the memory controller 100 may generate a configuration command including a blocking activation signal, and may transmit the configuration command to the interface device 200. The interface device 200 may activate the blocking function by storing the blocking activation signal in the region 210a of the blocking configuration unit 210 in response to the configuration command transmitted by the memory controller 100. A slashed region 210a may indicate that a blocking activation signal is now being stored.

As described above, the memory controller 100 may generate a configuration command including the address of the blocking configuration unit 210 and a blocking activation signal, and may transmit the configuration command to the interface device 200. The interface device 200 may activate the blocking function by recognizing the address of the blocking configuration unit 210 in the configuration command and storing the blocking activation signal in the region 210a.

In an embodiment, the address of the blocking configuration unit 210 may be a value which can be recognized by the interface device 200, but cannot be recognized by the memory device 300.

Figure 4:
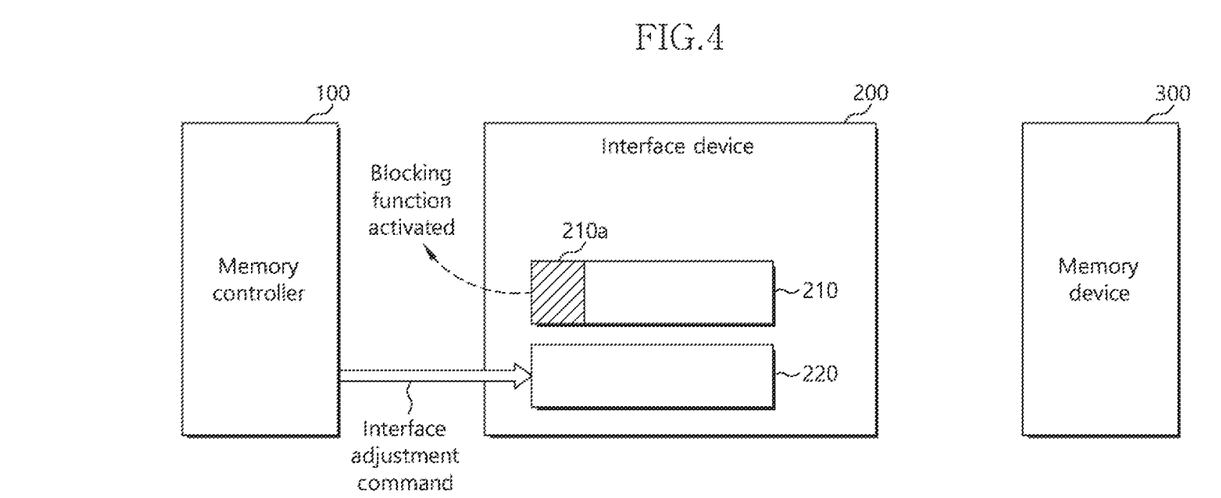
FIG. 4 is a diagram illustrating a method for the memory controller to control an interface configuration operation of the interface device in accordance with an embodiment.

FIG. 4 is a diagram illustrating a method for the memory controller 100 to control an interface configuration operation of the interface device 200 in accordance with an embodiment. Referring to FIG. 4, the interface device 200 may perform an interface configuration operation in response to an interface configuration command transmitted by the memory controller 100, while the blocking function is activated.

Specifically, the memory controller 100 may generate an interface configuration command and transmit the interface configuration command to the interface device 200. The interface device 200 may not transmit the interface configuration command to the memory device 300 because the blocking function has been activated. The interface device 200 may adjust an interface configuration value stored in the interface configuration unit 220 by performing an interface configuration operation in response to the interface configuration command transmitted by the memory controller 100.

Figure 5:
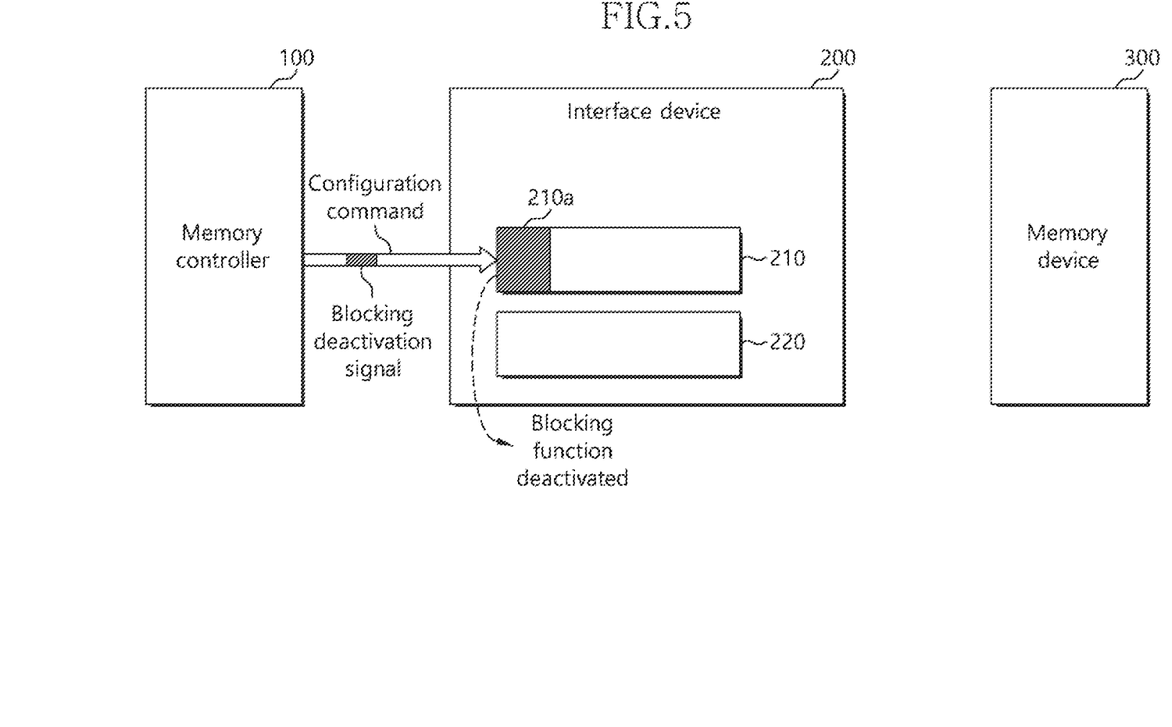
FIG. 5 is a diagram illustrating a method for the memory controller to deactivate the blocking function of the interface device in accordance with an embodiment.

FIG. 5 is a diagram illustrating a method for the memory controller 100 to deactivate the blocking function of the interface device 200 in accordance with an embodiment. Referring to FIG. 5, the interface device 200 may deactivate the blocking function in response to a configuration command transmitted by the memory controller 100.

Specifically, the memory controller 100 may generate a configuration command including a blocking deactivation signal, and may transmit the configuration command to the interface device 200. The interface device 200 may deactivate the blocking function by storing the blocking deactivation signal in the region 210a of the blocking configuration unit 210 in response to the configuration command transmitted by the memory controller 100.

As described above, the memory controller 100 may generate a configuration command, including the address of the blocking configuration unit 210 and a blocking deactivation signal, and may transmit the configuration command to the interface device 200. The interface device 200 may deactivate the blocking function by recognizing the address of the blocking configuration unit 210 in the configuration command and storing the blocking deactivation signal in the region 210a of the blocking configuration unit 210.

Figure 6:
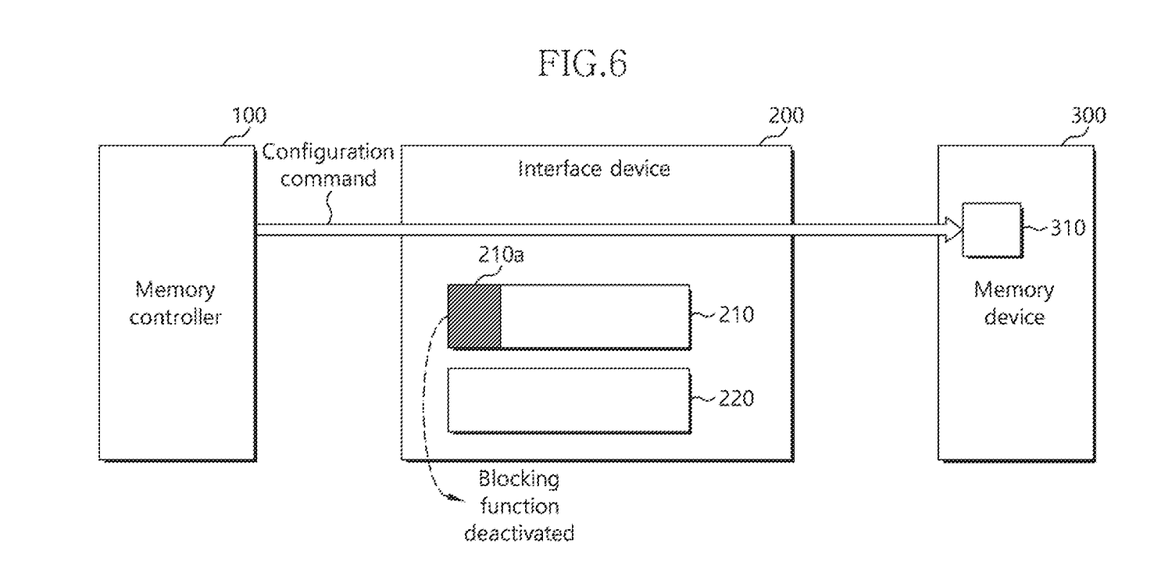
FIG. 6 is a diagram illustrating a method for the interface device performing an interfacing operation on a configuration command in accordance with an embodiment.

FIG. 6 is a diagram illustrating a method for the interface device 200 to perform an interfacing operation on a configuration command in accordance with an embodiment. Referring to FIG. 6, the interface device 200 may transmit a configuration command, transmitted by the memory controller 100, to the memory device 300 by performing an interfacing operation while the blocking function is deactivated.

Specifically, the memory controller 100 may generate a configuration command and transmit the configuration command to the interface device 200 in order to control a memory configuration operation of the memory device 300, while the blocking function of the interface device 200 is deactivated. That is, the memory controller 100 may use the configuration command to control a memory configuration operation of the memory device 300, while the blocking function of the interface device 200 is deactivated. In this case, the configuration command may not include the address of the blocking configuration unit 210, and may not include a blocking activation signal or a blocking deactivation signal.

The interface device 200 may receive a configuration command from the memory controller 100 and transmit the configuration command to the memory device 300.

The memory device 300 may perform a memory configuration operation in response to the configuration command transmitted by the interface device 200. Specifically, the memory device 300 may include a memory configuration unit 310 to which reference is made to perform an internal operation. The memory configuration unit 310 includes all circuits, systems, software, firmware and devices necessary for its operations and functions. The memory device 300 may adjust a memory configuration value stored in the memory configuration unit 310 by performing the memory configuration operation. For example, the memory configuration value may include various internal data values, voltage levels, and operation thresholds used by the memory device 300.

In an embodiment, an address may be assigned to the memory configuration unit 310. In such a case, the memory controller 100 may generate a configuration command, including the address of the memory configuration unit 310, in order to control a memory configuration operation of the memory device 300. The interface device 200 may transmit the configuration command to the memory device 300 because the configuration command transmitted by the memory controller 100 does not include the address of the blocking configuration unit 210 while the blocking function is deactivated. The memory device 300 may recognize the address of the memory configuration unit 310 in the configuration command, and may adjust a memory configuration value stored in the memory configuration unit 310.

In an embodiment, the memory controller 100 may use a configuration command in order to control an interface configuration operation of the interface device 200 while the blocking function is activated, as in the case where the memory controller 100 uses a configuration command in order to control a memory configuration operation of the memory device 300 while the blocking function is deactivated. That is, the configuration command may be used as the above-described interface configuration command while the blocking function is activated. In this case, an address may be assigned to the interface configuration unit 220. Accordingly, while the blocking function is activated, the memory controller 100 may generate a configuration command including the address of the interface configuration unit 220, and may transmit the configuration command to the interface device 200. The interface device 200 may recognize the address of the interface configuration unit 220 in the configuration command transmitted by the memory controller 100, and may adjust an interface configuration value stored in the interface configuration unit 220.

Figure 7:
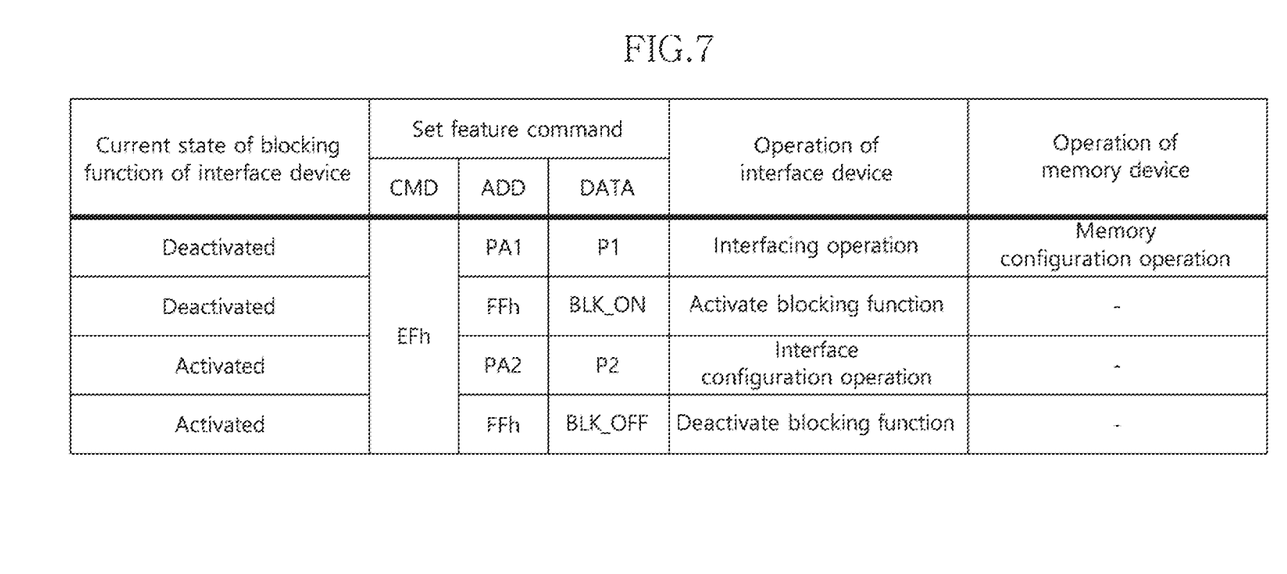
FIG. 7 is a diagram illustrating a method of using a set feature command in accordance with an embodiment.

FIG. 7 is a diagram illustrating a method of using a set feature command in accordance with an embodiment.

Referring to FIG. 7, in an embodiment, when the memory device 300 is a flash memory device 300, a set feature command defined in an open NAND flash interface (ONFI) may be used as the configuration command and interface configuration command described above with reference to FIGS. 1 to 6. That is, the memory controller 100 may control the blocking function and interface configuration operation of the interface device 200 in addition to the memory configuration operation of the memory device 300, using the set feature command.

The set feature command may include a command signal CMD, an address signal ADD, and a data signal DATA transmitted in a command cycle, an address cycle, and a data cycle, respectively. The command signal CMD may be a signal indicating that a currently transmitted command is a set feature command. For example, the command signal CMD having a value EFh may be transmitted. In order to control each operation, the memory controller 100 may generate the address signal ADD and the data signal DATA in the set feature command, as will be described below.

First, in order to control a memory configuration operation of the memory device 300 while the blocking function of the interface device 200 is deactivated, the memory controller 100 may generate, as the address signal ADD, an address PA1 of the memory configuration unit (310 of FIG. 6) on which the memory device 300 will perform a memory configuration operation. Furthermore, the memory controller 100 may generate, as the data signal DATA, a memory configuration value P1 to be stored in the memory configuration unit 310 by the memory device 300. Accordingly, the interface device 200 may transmit the set feature command to the memory device 300 by performing an interfacing operation in response to the set feature command transmitted by the memory controller 100. The memory device 300 may recognize the address PA1 of the memory configuration unit 310 and store the memory configuration value P1 in the memory configuration unit 310, in response to the set feature command transmitted by the interface device 200.

Furthermore, in order to activate the blocking function of the interface device 200 while the blocking function is deactivated, the memory controller 100 may generate an address FFh of the blocking configuration unit 210 of the interface device 200 as the address signal ADD. Furthermore, the memory controller 100 may generate a blocking activation signal BLK_ON as the data signal DATA. Accordingly, the interface device 200 may activate the blocking function by recognizing the address FFh of the blocking configuration unit 210 and storing the blocking activation signal BLK_ON in the blocking configuration unit 210, in response to the set feature command transmitted by the memory controller 100.

Furthermore, in order to control an interface configuration operation of the interface device 200 while the blocking function of the interface device 200 is activated, the memory controller 100 may generate, as the address signal ADD, an address PA2 of the interface configuration unit 220 on which the interface device 200 will perform an interface configuration operation. Furthermore, the memory controller 100 may generate, as the data signal DATA, an interface configuration value P2 to be stored in the interface configuration unit 220 by the interface device 200. Accordingly, the interface device 200 may recognize the address PA2 of the interface configuration unit 220 and store the interface configuration value P2 in the interface configuration unit 220, in response to the set feature command transmitted by the memory controller 100.

Furthermore, in order to deactivate the blocking function of the interface device 200 while the blocking function is activated, the memory controller 100 may generate the address FFh of the blocking configuration unit 210 of the interface device 200 as the address signal ADD. Furthermore, the memory controller 100 may generate a blocking deactivation signal BLK_OFF as the data signal DATA. Accordingly, the interface device 200 may deactivate the blocking function by recognizing the address FFh of the blocking configuration unit 210 and storing the blocking deactivation signal BLK_OFF in the blocking configuration unit 210, in response to the set feature command transmitted by the memory controller 100.

In an embodiment, if the set feature command includes a plurality of times of data cycles, the memory controller 100 may transmit the blocking activation signal BLK_ON or the blocking deactivation signal BLK_OFF in at least one data cycle previously agreed with the interface device 200.

In an embodiment, the interface configuration command may include a ZQ calibration command and a training command defined in the ONFI in addition to the set feature command. A method using the ZQ calibration command and the training command as an interface configuration command is similar to the method using the set feature command, and a detailed description thereof is omitted.

Figure 8:
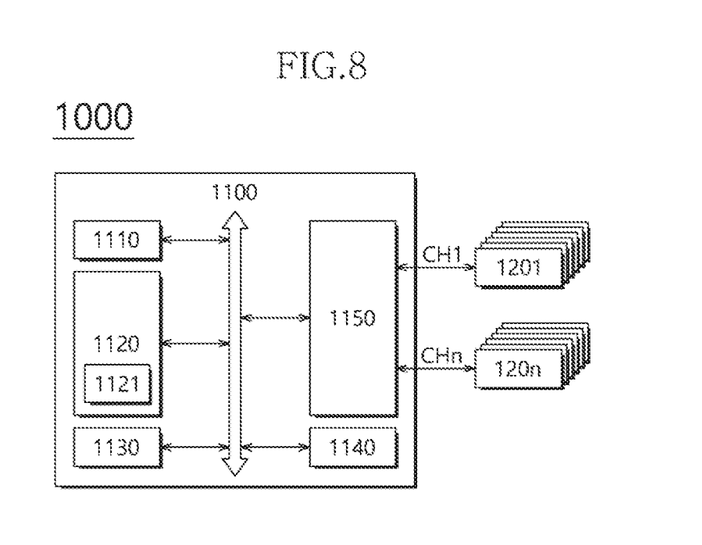
FIG. 8 is a diagram illustrating a memory system in accordance with another embodiment.

FIG. 8 is a diagram illustrating a memory system 1000 in accordance with another embodiment.

Referring to FIG. 8, the memory system 1000 may include a controller 1100 and nonvolatile memory devices 1201 to 120n.

The controller 1100 may control a general operation of the memory system 1000. The controller 1100 may include a host interface unit 1110, a control unit 1120, a random access memory 1130, an Error Correction Code (ECC) unit 1140, and a memory interface unit 1150.

The host interface unit 1110 may exchange signals with an external host device. In this case, the signals may include a command, an address, data, etc. The host interface unit 1110 may interface between the memory system 1000 and the host device according to the protocol of the host device. For example, the host interface unit 1110 may communicate with the host device through any one of standard interface protocols, such as secure digital, a Universal Serial Bus (USB), a Multi-Media Card (MMC), an embedded MMC (eMMC), Personal Computer Memory Card International Association (PCMCIA), Parallel Advanced Technology Attachment (PATA), Serial Advanced Technology Attachment (SATA), Small Computer System Interface (SCSI), an Serial Attached SCSI (SAS), Peripheral Component Interconnection (PCI), PCI Express (PCIe), and Universal Flash Storage (UFS).

The control unit 1120 may analyze and process a signal received from the host device. The control unit 1120 may control operations of background function blocks according to firmware or software for driving the memory system 1000.

The control unit 1120 may include a memory controller 1121. The memory controller 1121 may be configured to be substantially the same as the memory controller 100 of FIG. 1.

The random access memory 1130 may be used as a working memory for driving firmware or software. Furthermore, the random access memory 1130 may temporarily store data to be stored in the nonvolatile memory devices 1201 to 120n. Furthermore, the random access memory 1130 may temporarily store data read from the nonvolatile memory devices 1201 to 120n. In an embodiment, the random access memory 1130 may be positioned outside the controller 1100, unlike the configuration shown in FIG. 8.

The ECC unit 1140 may generate the parity data of data to be transmitted to the nonvolatile memory devices 1201 to 120n. The generated parity data may be stored in the nonvolatile memory devices 1201 to 120n along with the data. The ECC unit 1140 may detect an error of data, read from the nonvolatile memory devices 1201 to 120n, based on the parity data. If the detected error is within a correction range, the ECC unit 1140 may correct the detected error.

The memory interface unit 1150 may provide a control signal, such as a command and an address, to the nonvolatile memory devices 1201 to 120n under the control of the control unit 1120. Furthermore, the memory interface unit 1150 may exchange data with the nonvolatile memory devices 1201 to 120n under the control of the control unit 1120. For example, the memory interface unit 1150 may provide the nonvolatile memory devices 1201 to 120n with data stored in the random access memory 1130 or may provide the random access memory 1130 with data read from the nonvolatile memory devices 1201 to 120n. The memory interface unit 1150 may operate substantially identically with the interface device 200 of FIG. 1.

The nonvolatile memory devices 1201 to 120n may be used as the storage medium of the memory system 1000. The nonvolatile memory devices 1201 to 120n may be electrically coupled to the controller through a plurality of channels CH1 to CHn. One or more nonvolatile memory devices may be electrically coupled to one channel. The nonvolatile memory devices 1201 to 120n electrically coupled to one channel may be electrically coupled to the same signal bus and data bus.

Figure 9:
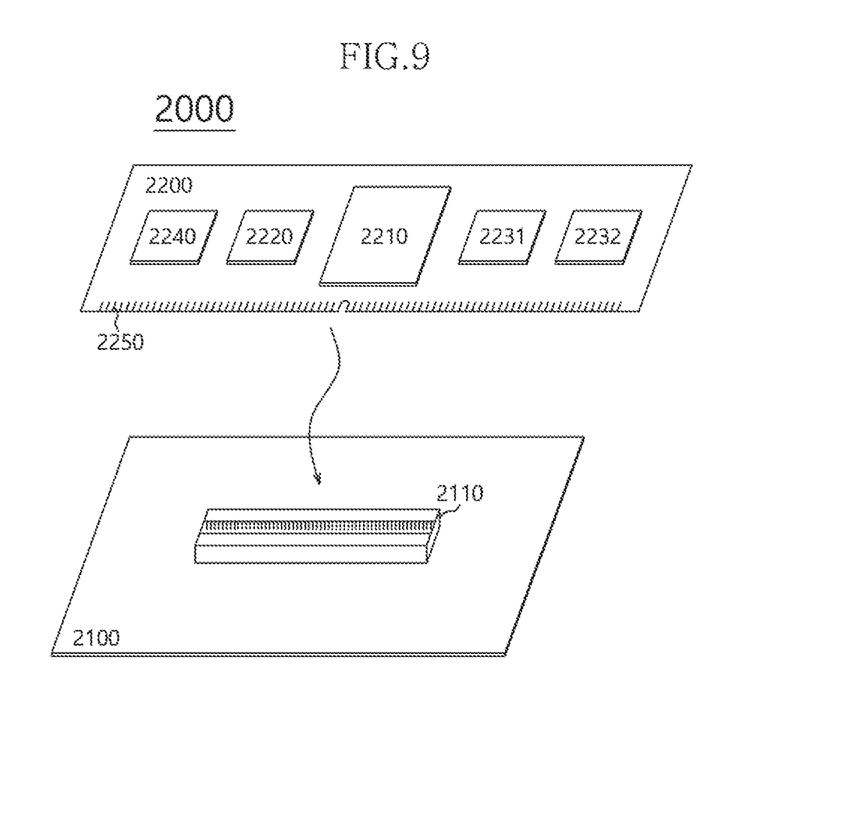
FIG. 9 is a diagram illustrating a data processing system including a memory system in accordance with an embodiment.

FIG. 9 is a diagram illustrating a data processing system 2000 including a memory system 2200 in accordance with an embodiment. Referring to FIG. 9, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 8.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth, and power may be transferred between the host device 2100 and the memory system 2200. The connection terminal 2250 may be configured as various types depending on an interface scheme between the host device 2100 and the memory system 2200. The connection terminal 2250 may be disposed on any one side of the memory system 2200.

Figure 10:
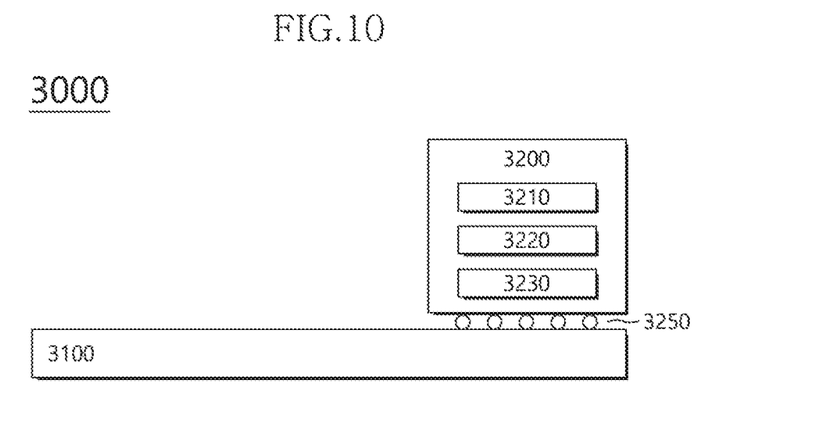
FIG. 10 is a diagram illustrating a data processing system including a memory system in accordance with an embodiment.

FIG. 10 is a diagram illustrating a data processing system 3000 including a memory system 3200 in accordance with an embodiment. Referring to FIG. 10, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 8.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 11:
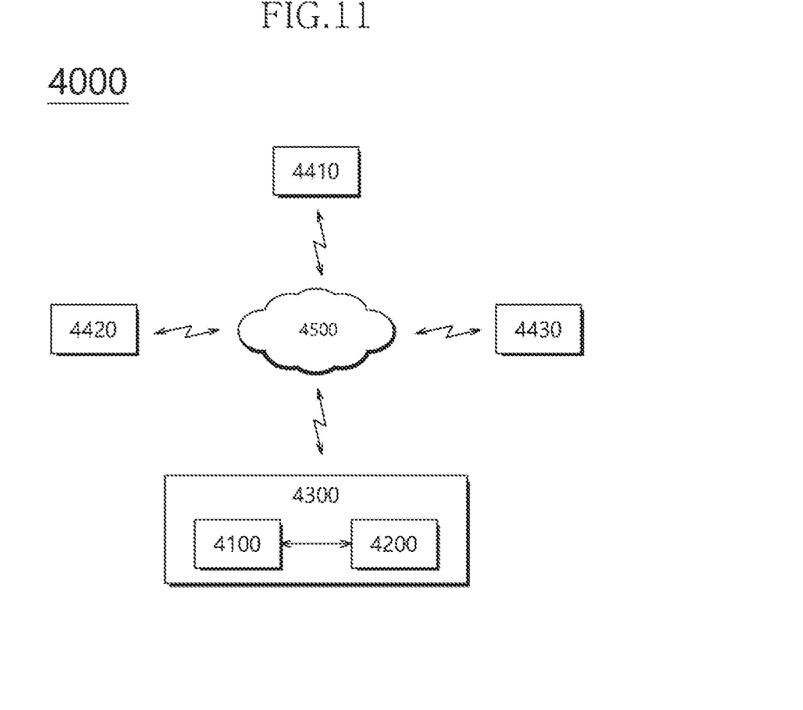
FIG. 11 is a diagram illustrating a network system including a memory system in accordance with an embodiment.

FIG. 11 is a diagram illustrating a network system 4000 including a memory system 4200 in accordance with an embodiment. Referring to FIG. 11, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 10 shown in FIG. 1, the memory system 1000 shown in FIG. 8, the memory system 2200 shown in FIG. 9 or the memory system 3200 shown in FIG. 10.

Figure 12:
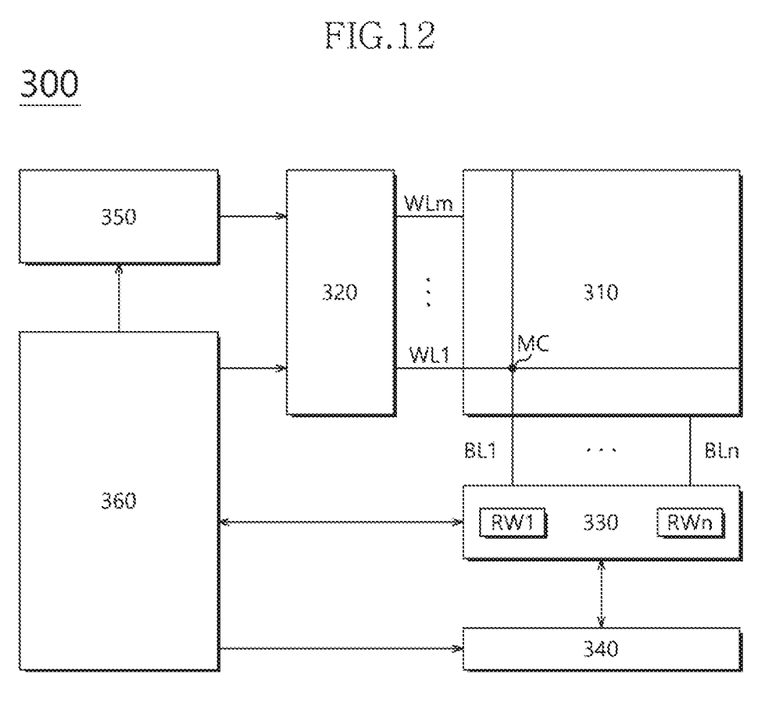
FIG. 12 is a block diagram illustrating a nonvolatile memory device included in a memory system in accordance with an embodiment.

FIG. 1.2 is a block diagram illustrating a nonvolatile memory device 300 included in a memory system in accordance with an embodiment. Referring to FIG. 1.2, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

The memory system in accordance with an embodiment can efficiently adjust the configuration of the interface device connected to the memory device.

Those skilled in the art to which the disclosure pertains should understand that the embodiments are only illustrative from all aspects not being limitative because the disclosure may be implemented in various other forms without departing from the technical spirit or essential characteristics of the disclosure. Accordingly, the scope of the disclosure is defined by the appended claims rather than by the detailed description, and all modifications or variations derived from the meanings and scope of the claims and equivalents thereof should be understood as being included in the scope of the disclosure.

What is claimed is:

1. A memory system, comprising:
a memory device;
a memory controller configured to control the memory device; and
an interface device configured to perform an interfacing operation for transmission of a control signal and data between the memory device and the memory controller, and include an interface configuration unit in which an interface configuration value is stored and which is referenced when performing the interfacing operation,
wherein the interface device activates a blocking function for the interfacing operation in response to a configuration command comprising a blocking activation signal of the memory controller and adjusts the interface configuration value by performing an interface configuration operation in response to an interface configuration command comprising an address of the interface configuration unit of the memory controller while the blocking function is activated.

2. The memory system of claim 1, wherein:
the interface device comprises a blocking configuration unit, and
the interface device activates the blocking function by storing the blocking activation signal in the blocking configuration unit when the configuration command comprises an address of the blocking configuration unit.

3. The memory system of claim 1, wherein the interface device deactivates the blocking function in response to the configuration command comprising a blocking deactivation signal while the blocking function is activated.

4. The memory system of claim 3, wherein
the interface device comprises a blocking configuration unit,
wherein the interface device activates the blocking function by storing the blocking activation signal in the blocking configuration unit when the configuration command comprises an address of the blocking configuration unit, and
wherein the interface device deactivates the blocking function by storing the blocking deactivation signal in the blocking configuration unit when the configuration command comprises the address of the blocking configuration unit.

5. The memory system of claim 1, wherein the interface device transmits a command to the memory device by performing the interfacing operation when the command is received while the blocking function is deactivated.

6. The memory system of claim 1, wherein
the memory device comprises a memory configuration unit in which a memory configuration value is stored and which is referenced when performing an internal operation,
wherein the interface device transmits the configuration command comprising an address of the memory configuration unit to the memory device by performing the interfacing operation in response to the configuration command while the blocking function is deactivated, and
wherein the memory device adjusts the memory configuration value in response to the configuration command.

7. A memory system, comprising:
a memory device;
a memory controller configured to generate a command for controlling the memory device; and
an interface device configured to include a blocking configuration unit, and transmit the command to the memory device by performing an interfacing operation in response to the command transmitted by the memory controller while a blocking function is deactivated, wherein the memory controller transmits the command, which includes an address of the blocking configuration unit and a blocking activation signal, to the interface device, and wherein the interface device activates the blocking function by recognizing the address of the blocking configuration unit and storing the blocking activation signal in the blocking configuration unit in response to the command including the blocking activation signal and does not perform the interfacing operation while the blocking function is activated.

8. The memory system of claim 7, wherein the memory controller transmits the command, which includes a blocking deactivation signal, to the interface device while the blocking function is activated, and wherein the interface device deactivates the blocking function in response to the command including the blocking deactivation signal.

9. The memory system of claim 8, wherein the interface device includes a blocking configuration unit, wherein the memory controller transmits the command, which includes an address of the blocking configuration unit and the blocking deactivation signal, to the interface device, and wherein the interface device deactivates the blocking function by recognizing the address of the blocking configuration unit and storing the blocking deactivation signal in the blocking configuration unit.

10. The memory system of claim 7, wherein the memory controller transmits an interface configuration command to the interface device while the blocking function is activated, and wherein the interface device adjusts an interface configuration value and performs the interfacing operation in response to the interface configuration command using the interface configuration value.

11. The memory system of claim 10, wherein the interface device includes an interface configuration unit in which the interface configuration value is stored, wherein the memory controller transmits the interface configuration command, which includes an address of the interface configuration unit, to the interface device, and wherein the interface device recognizes the address of the interface configuration unit and adjusts the interface configuration value in response to the interface configuration command.

12. The memory system of claim 7, wherein the memory device includes a memory configuration unit in which a memory configuration value is stored, and performs an internal operation, wherein the memory controller transmits the command, which includes an address of the memory configuration unit, to the interface device while the blocking function is deactivated, wherein the interface device transmits the command to the memory device by performing the interfacing operation in response to the command comprising the address of the memory configuration unit, and wherein the memory device recognizes the address of the memory configuration unit and adjusts the memory configuration value in response to the command.

13. A memory system, comprising:
a memory device;
a memory controller; and
an interface device including a blocking configuration unit and configured to perform an interfacing operation between the memory device and the memory controller, wherein the memory controller activates a blocking function of the interface device by accessing the blocking configuration unit and transmits an interface configuration command to the interface device while the blocking function is activated, and wherein the interface device does not perform the interfacing operation while the blocking function is activated and adjusts an interface configuration value and performs the interfacing operation in response to the interface configuration command.

14. The memory system of claim 13, wherein the memory controller transmits a configuration command, including an address of the blocking configuration unit and a blocking activation signal, to the interface device, and wherein the interface device activates the blocking function by recognizing the address of the blocking configuration unit and storing the blocking activation signal in the blocking configuration unit in response to the configuration command.

15. The memory system of claim 13, wherein the memory controller transmits a configuration command, including an address of the blocking configuration unit and a blocking deactivation signal, to the interface device while the blocking function is activated, and wherein the interface device deactivates the blocking function by recognizing the address of the blocking configuration unit and storing the blocking deactivation signal in the blocking configuration unit in response to the configuration command.

16. The memory system of claim 13, wherein the interface device includes an interface configuration unit in which the interface configuration value is stored, wherein the memory controller transmits the interface configuration command, comprising an address of the interface configuration unit, to the interface device, and wherein the interface device recognizes the address of the interface configuration unit and adjusts the interface configuration value in response to the interface configuration command.

17. The memory system of claim 13, wherein the memory device includes a memory configuration unit in which a memory configuration value is stored and performs an internal operation, wherein the memory controller transmits a configuration command, which includes an address of the memory configuration unit, to the interface device while the blocking function is deactivated, wherein the interface device transmits the configuration command to the memory device by performing the interfacing operation, and wherein the memory device recognizes the address of the memory configuration unit and adjusts the memory configuration value in response to the configuration command.

* * * * *